US010895588B1

(12) United States Patent
Pickerd et al.

(10) Patent No.: US 10,895,588 B1
(45) Date of Patent: Jan. 19, 2021

(54) APPARATUS AND METHOD FOR DE-EMBEDDING A COMBINER FROM A BALANCED SIGNAL

(71) Applicant: Tektronix, Inc., Beaverton, OR (US)

(72) Inventors: John J. Pickerd, Hillsboro, OR (US); Pirooz Hojabri, San Jose, CA (US); Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 369 days.

(21) Appl. No.: 15/958,927

(22) Filed: Apr. 20, 2018

Related U.S. Application Data

(60) Provisional application No. 62/488,390, filed on Apr. 21, 2017.

(51) Int. Cl.
*G01R 1/28* (2006.01)
*G01R 1/30* (2006.01)
*H04L 25/03* (2006.01)
*H04B 15/00* (2006.01)

(52) U.S. Cl.
CPC ............... *G01R 1/28* (2013.01); *G01R 1/30* (2013.01); *H04B 15/00* (2013.01); *H04L 25/03828* (2013.01)

(58) Field of Classification Search
CPC ....... G01R 1/28; G01R 1/30; H04L 25/03828; H04L 25/03031; H04B 15/00; H04B 1/1018; H04B 1/0057
See application file for complete search history.

(56) References Cited

U.S. PATENT DOCUMENTS

| 2004/0023631 | A1* | 2/2004 | Deutsch ................. H04B 10/25 455/283 |
| 2018/0026816 | A1* | 1/2018 | Pickerd ............. H04L 25/03828 375/232 |

* cited by examiner

*Primary Examiner* — Amy He
(74) *Attorney, Agent, or Firm* — Miller Nash Graham & Dunn; Andrew J. Harrington

(57) ABSTRACT

A test and measurement system including a plurality of channels and one or more processors. The one or more processors are configured to cause the test and measurement system to receive, via a first channel of the plurality of channels, a positive side of a reference differential signal pair, receive, via a second channel of the plurality of channels, a negative side of the reference differential signal pair, and produce a reference signal based the reference differential signal pair. A combined signal is received, from a combiner, that is a balanced signal produced from the reference differential signal pair. A de-embed filter is generated based on the reference signal and the combined signal and an additional signal is received from the combiner and an effect of the combiner is removed from the additional signal by applying the de-embed filter to the additional signal.

20 Claims, 9 Drawing Sheets

US 10,895,588 B1

APPARATUS AND METHOD FOR DE-EMBEDDING A COMBINER FROM A BALANCED SIGNAL

PRIORITY

This disclosure claims benefit of U.S. Provisional Application No. 62/488,390, titled "ACQUSITION FIXTURE WITH BALUN DESKEW, DE-EMBED, AND NOISE REDUCTION CALIBRATION," filed on Apr. 21, 2017, which is incorporated herein by reference in its entirety.

FIELD OF THE INVENTION

This disclosure is directed to systems and methods related to test and measurement systems, and in particular, to test and measurements systems that de-embed a combiner from a balanced signal.

BACKGROUND

Many test and measurement instrument users are not highly skilled in the art of de-embedding devices from their test and measurement acquisition measurement circuit. As a result, when capturing a differential signal from a device under test (DUT), users are often not inclined to de-embed a combiner, such as a balun, which does not go all the way to zero frequency, also referred to as direct current (DC). However, it may be beneficial to use a balun, or other combiner, with a test and measurement instrument so that only one channel of the test and measurement instrument is utilized to acquire the differential signal.

There are software applications that use S-parameter models to attempt to de-embed devices and cables in a data acquisition system. However, these software applications only work reliably when the devices go to zero frequency, or DC. For a combiner 120 that does not go to DC, the inverse of the passband results in a large de-embed boost in the DC area. Applying a high-pass filter after this computation may not be adequate to de-embed the device and cables because the filter components may already be aliased.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is a test and measurement instrument, or system, such as an oscilloscope, which includes a plurality of channels and one or more processors, coupled with the plurality of channels. The one or more processors are configured to cause the test and measurement instrument, or system, to receive, via a first channel of the plurality of channels, a positive side of a reference differential signal pair, receive, via a second channel of the plurality of channels, a negative side of the reference differential signal pair, and produce a reference signal based on the positive side of the reference differential signal pair and the negative side of the reference differential signal pair. A combined signal may be received from a combiner, such as a balun, that is a balanced signal produced from the positive side of the reference differential signal pair and the negative side of the reference differential signal pair. A de-embed filter is generated based on the reference signal and the combined signal, and may be applied when an additional balanced signal, such as from a DUT, is received to remove an effect of the combiner from the additional balanced signal.

Embodiments of the disclosure allow for acquiring a differential signal from a DUT through a combiner using only a single channel in the test and measurement instrument. Using one channel of the test and measurement instrument reduces the noise from the test and measurement instrument in the stop band of the combiner. Embodiments also provide an operation for allowing a user to generate a de-embed filter for the acquisition fixture to de-embed the combiner from the acquired signal, which results in a less costly test and measurement setup.

Figure 1:
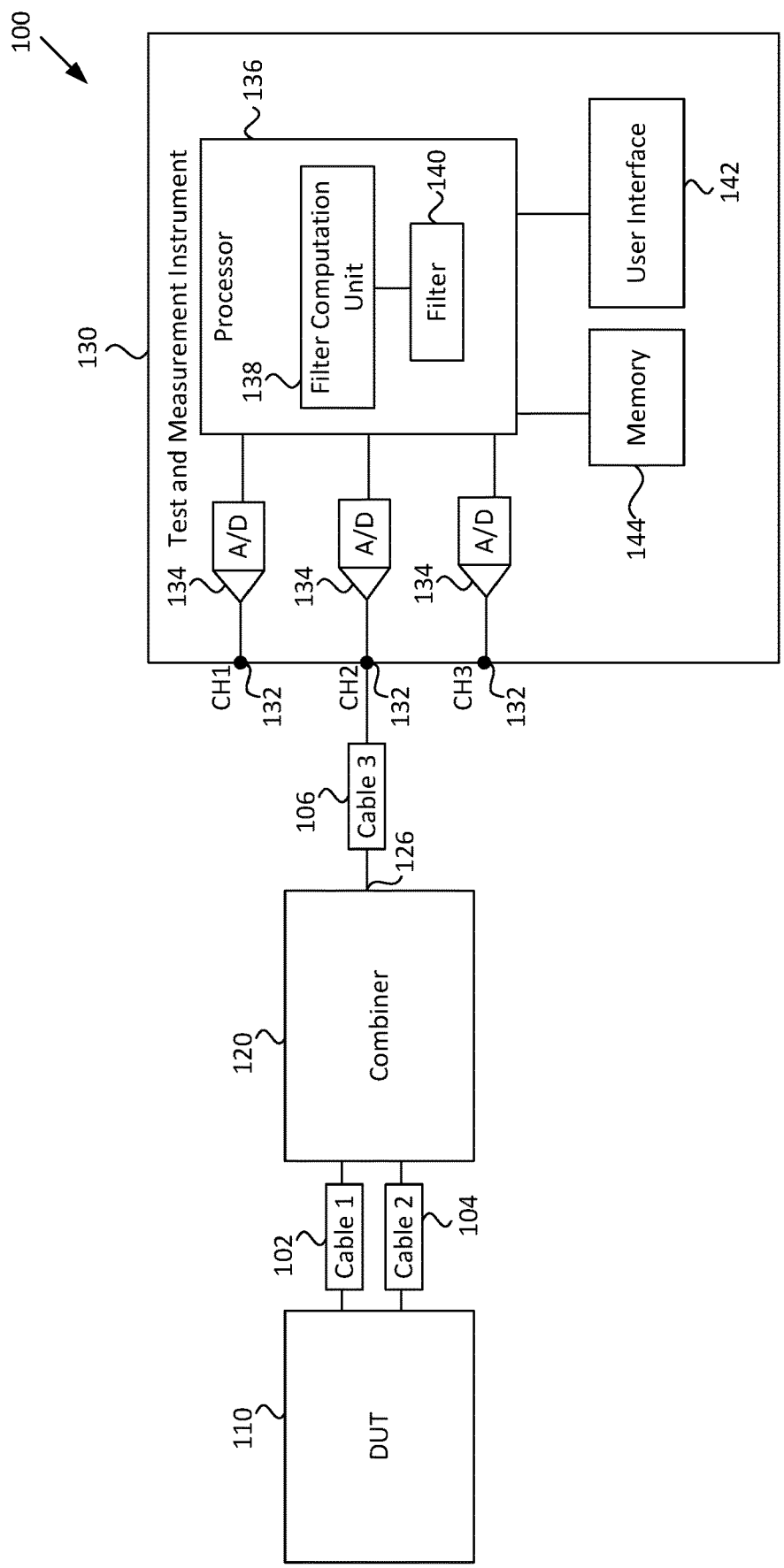
FIG. 1 shows a block diagram of a test and measurement system according to some embodiments of the disclosure.

FIG. 1 is a block diagram of a test and measurement system 100 according to embodiments of the disclosure. The test and measurement system 100 includes a DUT 110, a combiner 120, and a test and measurement instrument 130. The combiner 120 may be, for example, an amplifier, a high-pass device, such as a balun, or any other type of device that can combine two signals into a balanced signal. The combiner 120 includes two inputs to receive a first side of a differential signal pair and a second side of the differential signal pair, respectively, from a device under test 130 through two cables 102 and 104. The combiner 120 has one output 126 to output a differential signal through a cable 106. The differential signal is the difference between the signals received through the two cables 102 and 104.

The test and measurement instrument 130, may be, for example, an oscilloscope, spectrum analyzer, etc., which includes, among other components not shown, one or more channels 132, each channel 132 connected to an analog-to-digital converter (ADC) 134. Although FIG. 1 shows three channels 132 and three ADCs 134, embodiments of the disclosure are not limited to such a configuration. More or less than three channels 132 may be provided. The test and measurement instrument 130 also includes a processor 136, which may include a filter computation unit 138, which, as will be discussed in more detail below, generates one or more filters 140 based on calibration signals. The processor 136 uses the one or more filters 140 to process a signal from a combiner 120 to remove an effect of combiner 120. The test and measurement instrument 130 may also include a user interface 142, which allows a user to interact with the test and measurement instrument 130, and may include an input component, such as a touch screen, mouse, etc. and a display, to display information, such as the acquired signal, a menu, or other various information and outputs as would be understood by one skilled in the art. The test and measurement instrument 130 also includes one or more memories 144 that can be configured to store the acquired signal, or portions thereof, among other things.

To compute the one or more filters 140, a test assembly may be connected to the test and measurement instrument 130 either directly or indirectly through the combiner 120, to acquire reference signals and actual signals. As will be discussed in more detail below with respect to FIGS. 2-8, the test assembly may include a differential pulse generator (e.g., a time domain transmission (TDT) differential pulse generator), a pseudo random binary sequence (PRBS) generator, or a vector network analyzer.

Figure 2:
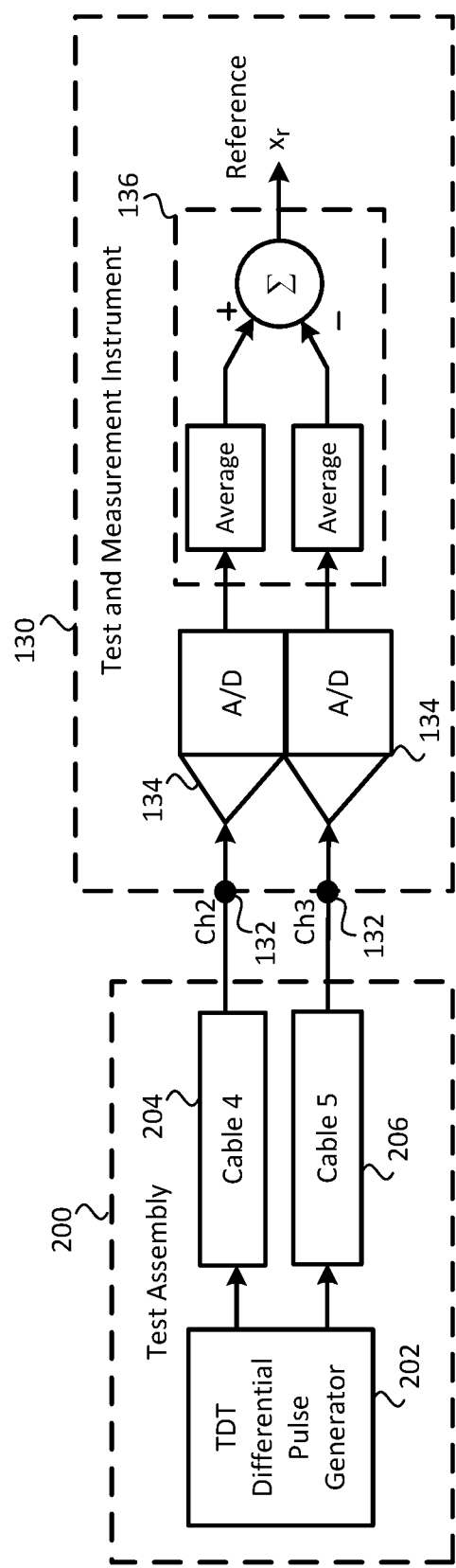
FIG. 2 shows a block diagram of a first configuration of a calibration procedure with a test assembly connected to the test and measurement instrument according to some embodiments of the disclosure.
Figure 3:
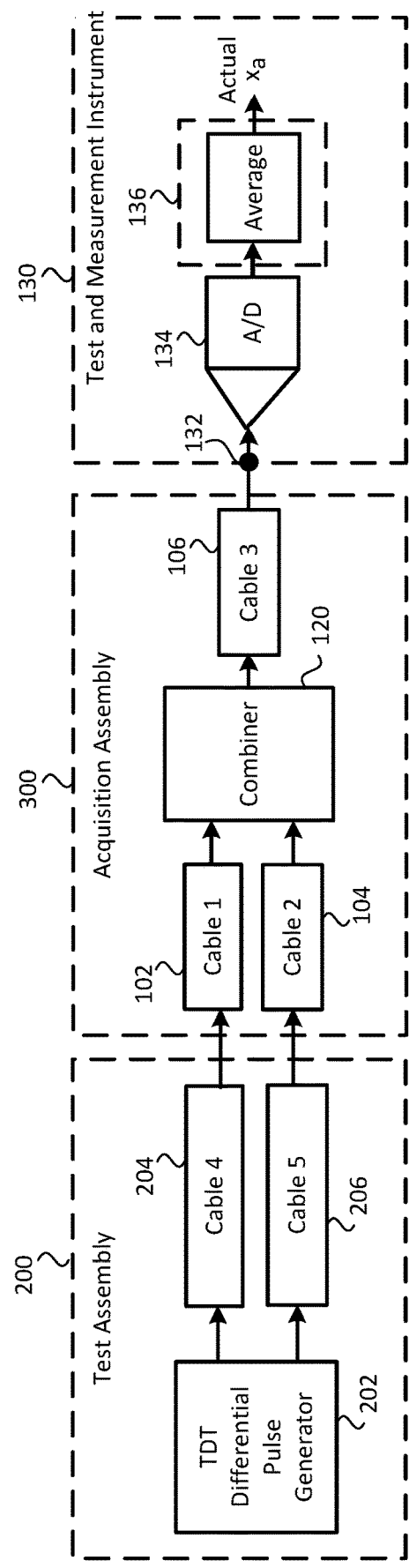
FIG. 3 shows a block diagram of a second process of the calibration procedure with the test assembly shown in FIG. 2 connected to the test and measurement instrument through an acquisition assembly according to some embodiments of the disclosure.
Figure 4:
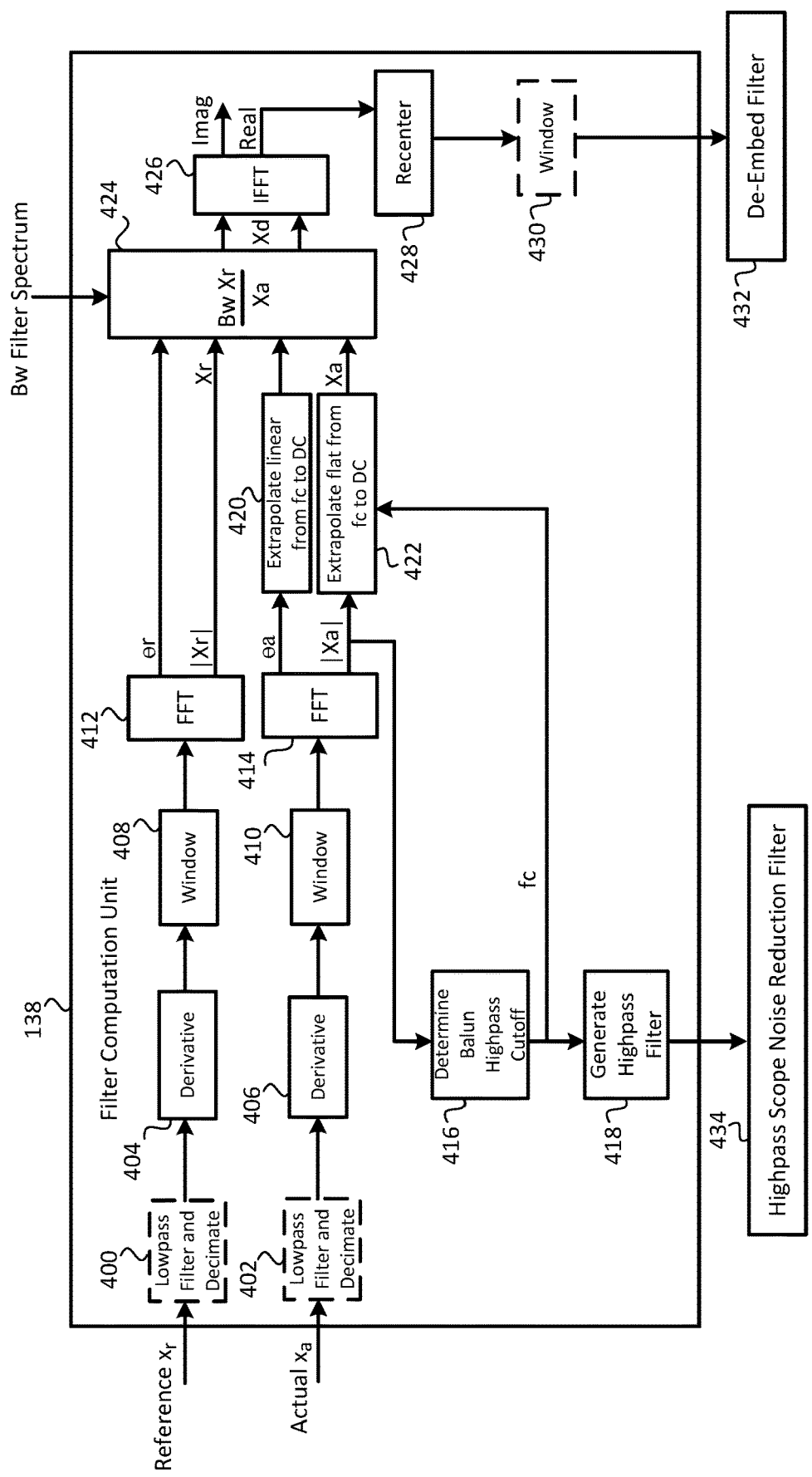
FIG. 4 shows a block diagram for generating one or more filters according to some embodiments of the disclosure.

FIGS. 2-4 illustrate calibrating the test and measurement instrument 130 using a test assembly 200 including a TDT differential pulse generator 202 attached to the test and measurement instrument 130 through cables 204 and 206. FIG. 2 illustrates acquiring a reference step signal $x_r$ by connecting the TDT differential pulse generator 202 to two channels 132 of the test and measurement instrument 130. One channel 132 receives a positive side of a reference differential signal pair from the TDT differential pulse generator 202 and the other channel receives a negative side of the reference differential signal pair from the TDT differential pulse generator 202. The positive side and negative side channels are each respectively received at a channel 132 and digitized through an ADC 134. A number of samples are taken and averaged, and the averaged samples are subtracted to determine a reference step signal $x_r$. The reference step signal $x_r$ may be saved in the memory 144 in the test and measurement instrument 130 for use by the filter computation unit 138 for generating one or more filters 140.

For the best acquisition, the cables 204 and 206 can be well-matched in phase and magnitude as a function of frequency for all frequencies of interest. That is, the TDT differential pulse generator 202 can have zero common mode output. Further, the two signal outputs of the TDT differential pulse generator 202 are deskewed for a more accurate acquisition at the cables 204 and 206 output reference plane from the TDT differential pulse generator 202. That is, the test and measurement instrument 130 can be set for zero, or minimal, skew between the channels and an algorithm may be used to adjust the TDT differential pulse generator 202 skew, as would be understood by one skilled in the art.

FIG. 3 illustrates acquiring an actual step signal $x_a$ for calibration. To acquire the actual step signal $x_a$, the test assembly 200 is connected to the test and measurement instrument 130 through an acquisition assembly 300, which includes cables 102, 104, and 106, as well as the combiner 120. The TDT differential pulse generator 202 outputs the same differential signal pair as in FIG. 2, and the positive side of the differential signal pair may be received at a first input of the combiner 120 through cable 102 and the negative side of the differential signal pair may be received at a second input of the combiner device through cable 104. The combiner 120 outputs a balanced signal produced from the positive side of the differential signal pair and the negative side of the differential signal pair. The balanced signal of the combiner 120 may be sent through the cable 106 to a channel 132 of the test and measurement instrument 130 and digitized through the ADC 134. Similar to FIG. 2, a number of samples may be acquired, and the processor 136 average the samples to determine an actual step signal $x_a$.

Once the reference step signal $x_r$ and the actual step signal $x_a$ have been acquired, the processor 136 generates one or more filters 140, such as a de-embed filter to be used by the processor 136 when a signal is received from the combiner 120 from the DUT 110. In some embodiments, the processor 136 may also generate a high-pass filter using the reference step signal $x_r$ and the actual step signal $x_a$.

FIG. 4 illustrates operation of the filter computation unit 138 according to some embodiments of the disclosure. As seen in FIG. 4, to compute the high pass filter and the de-embed filter, the reference step signal $x_r$ and the actual step signal $x_a$ may each pass through a decimation and low-pass filter 400 and 402. Each of the decimation and low-pass filters 400 and 402 are decimation filters that remove acquisition noise to prevent aliasing for the decimation operation. the reference step signal $x_r$ and the actual step signal $x_a$ may be oversampled at 1 T/s to remove sample jitter due to the asynchronous sample clock in the ADCs 134. The output sample rate, for example, may be 100 GS/s.

However, in an alternative embodiment, the reference step signal $x_r$ and the actual step signal $x_a$ may be acquired at lower sample rates and the decimation and low-pass filters 400 and 402 are not included. Rather, each acquisition can be resampled at the same sample rate but different sample positions to remove sample clock jitter. The result is averaged with previous acquisitions.

The derivative 404 and 406 converts the reference step signal $x_r$ and the actual step signal $x_a$ to an impulse response for computing the two spectrums of the reference step signal $x_r$ and the actual step signal $x_a$. A window function 408 and 410 can be applied to the impulse response to assure the ends of the record may be tapered to zero to prevent leakage. An example of such a window function is a Blackman Harris window. However, other types of window functions may be used, as would be understood by one skilled in the art.

A fast fourier transform (FFT) 412 and 414 converts the windowed impulse responses to the frequency domain to obtain $X_r$ and $X_a$, respectively. The magnitude $X_r$ and $X_a$ and the phase $\theta_r$ and $\theta_a$ of the FFT 412 and 414 results can be used for further processing steps.

The magnitude of $X_a$ as a function of frequency can be analyzed to determine the combiner 120 high-pass frequency cutoff fc 416. The frequency cutoff, fc, can be obtained and a set of high-pass filter coefficients can be determined 418 to generate a high-pass filter 434 to filter test and measurement instrument 130 noise that is added into the stop band of the combiner 120 (e.g., by an ADC). It will be appreciated that the generation of the high-pass filters can be omitted (e.g., where noise in the stop band is not a concern).

The spectrum of the actual step $X_a$ can be extrapolated from frequency slightly higher than the frequency cutoff fc down to DC. This is a linear extrapolation of the magnitude response 420. In some embodiments, the extrapolation may include averaging the magnitude response over a flat range and then point replicating from DC to the point the waveform intersects with the actual magnitude response. A similar extrapolation 422 may be performed on the phase of the actual step $X_a$. Several points may be used to make a linear regression estimate of the slope for the extrapolation. However, as will be understood by one skilled in the art, other extrapolation methods may be used. This extrapolation can be important in some instances to ensure that frequencies below the frequency cutoff of the combiner do not experience a de-embed boost.

Using a bandwidth limit filter, a spectrum of the de-embed filter can be determined 424 by dividing $X_r$ by $X_a$. This may include choosing a Nyquist frequency and creating a complex conjugate set of data above the Nyquist frequency to the sampling frequency such that the magnitude response on each side of the Nyquist frequency is symmetrical, and the phase response on each side is anti-symmetrical. An inverse FFT (IFFT) 426 can be applied to convert the result to the time domain. The imaginary part will be zero and the real part can be re-centered 428 in the circular output array to obtain the impulse response of the de-embed filter to generate the de-embed filter 432. In some embodiments, another window function 430 may be applied to prevent leakage to generate de-embed filter 432.

Figure 9:
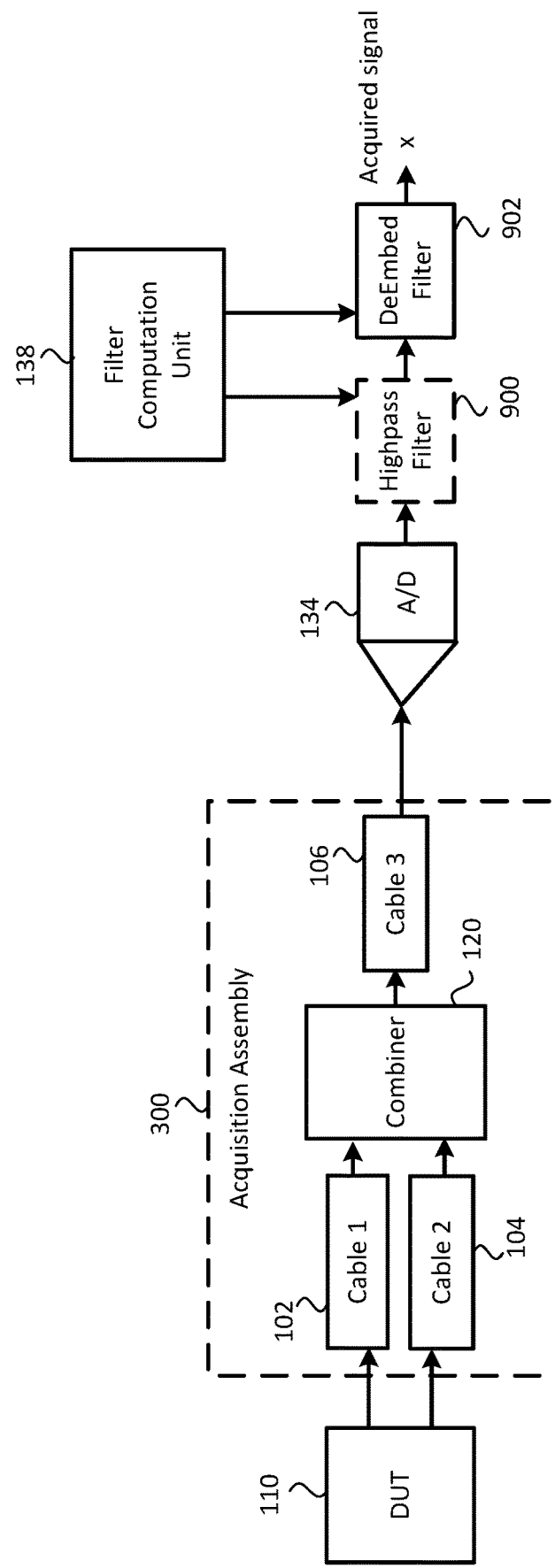
FIG. 9 shows a block diagram of a calibrated test and measurement system according to some embodiments of the disclosure.

This de-embed filter 432 and/or the high-pass filter 434 can be applied to the acquired signal from the combiner 120, as shown in FIGS. 1 and 9, when the combiner 120 is connected to the DUT 110.

Figure 5:
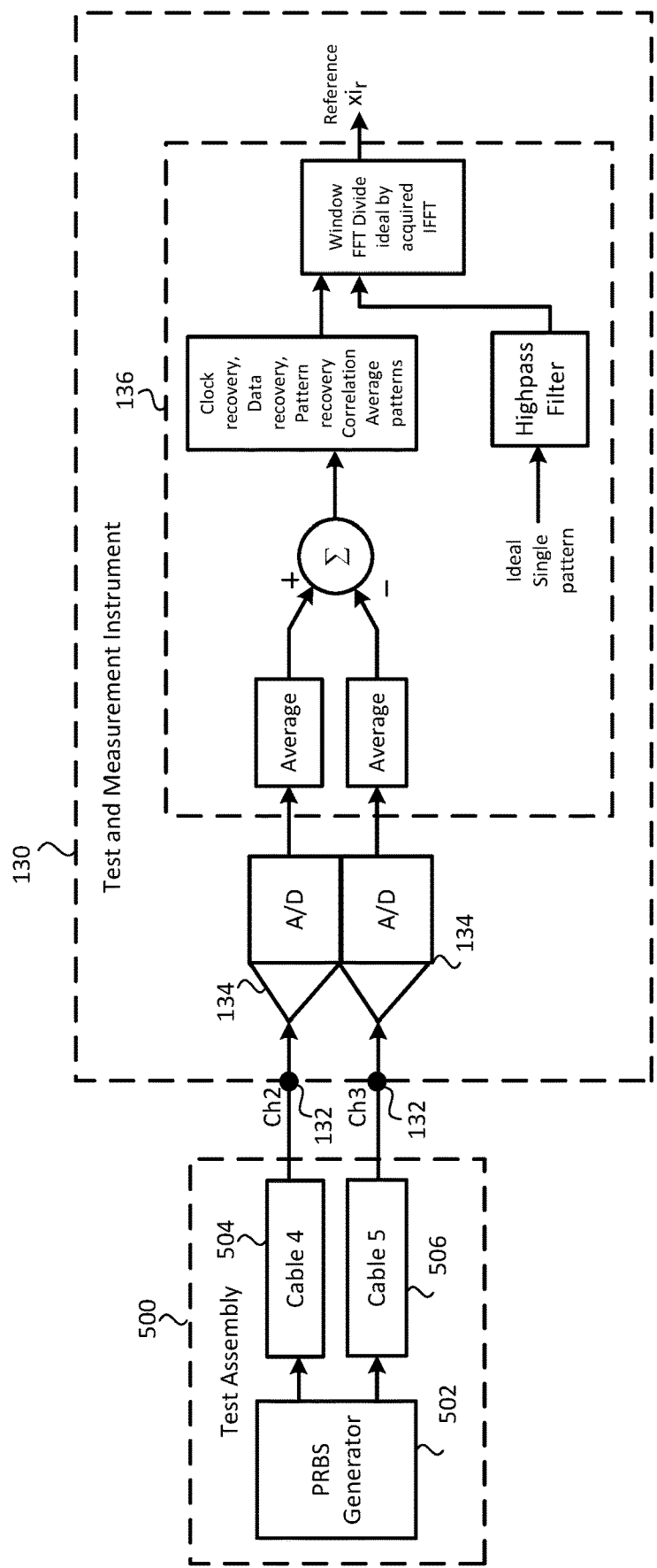
FIG. 5 shows a block diagram of another test assembly connected to the test and measurement instrument according to other embodiments of the disclosure.
Figure 6:
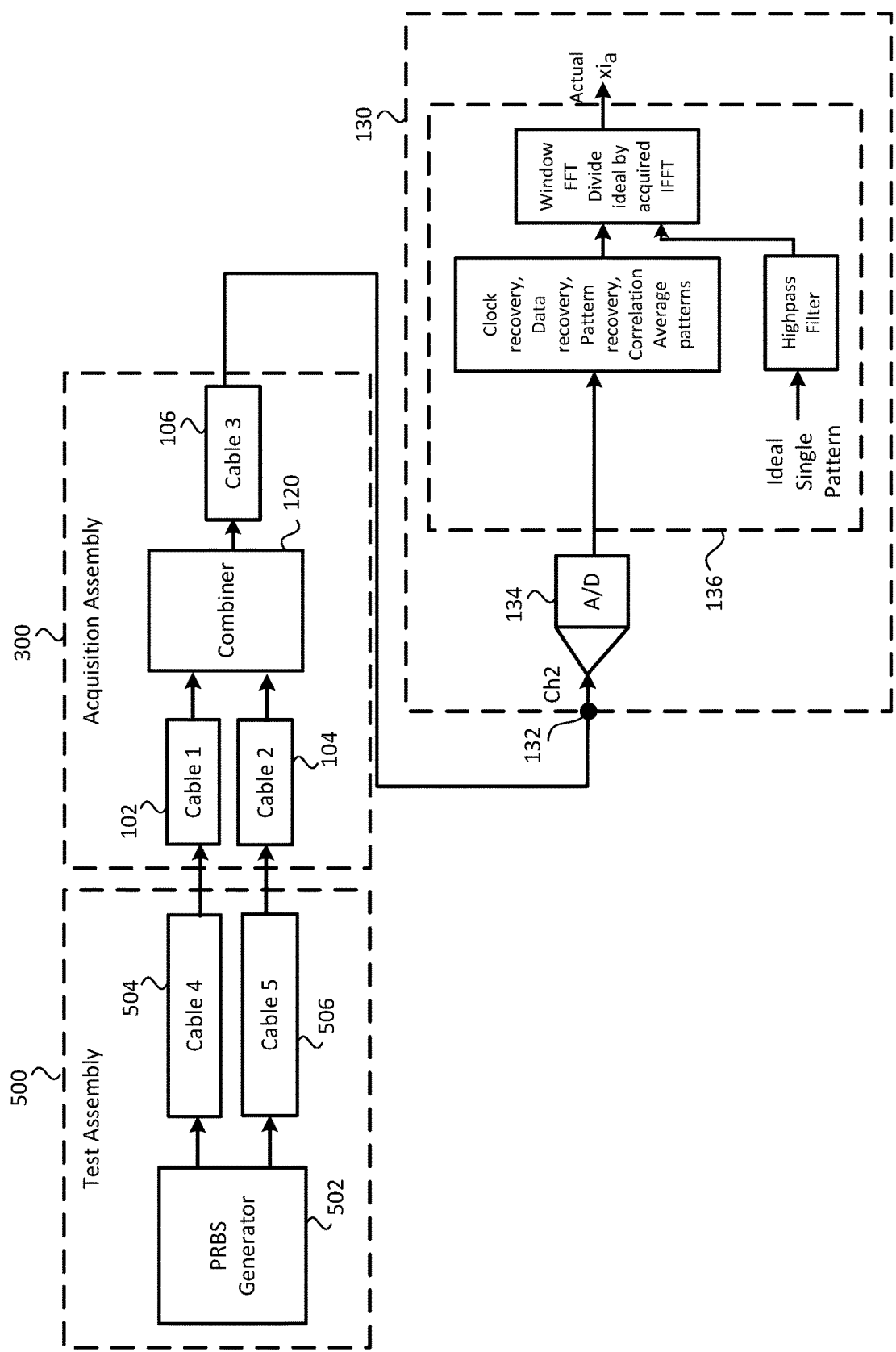
FIG. 6 shows a block diagram of the test assembly shown in FIG. 5 connected to the test and measurement instrument through an acquisition assembly according to other embodiments of the disclosure.
Figure 7:
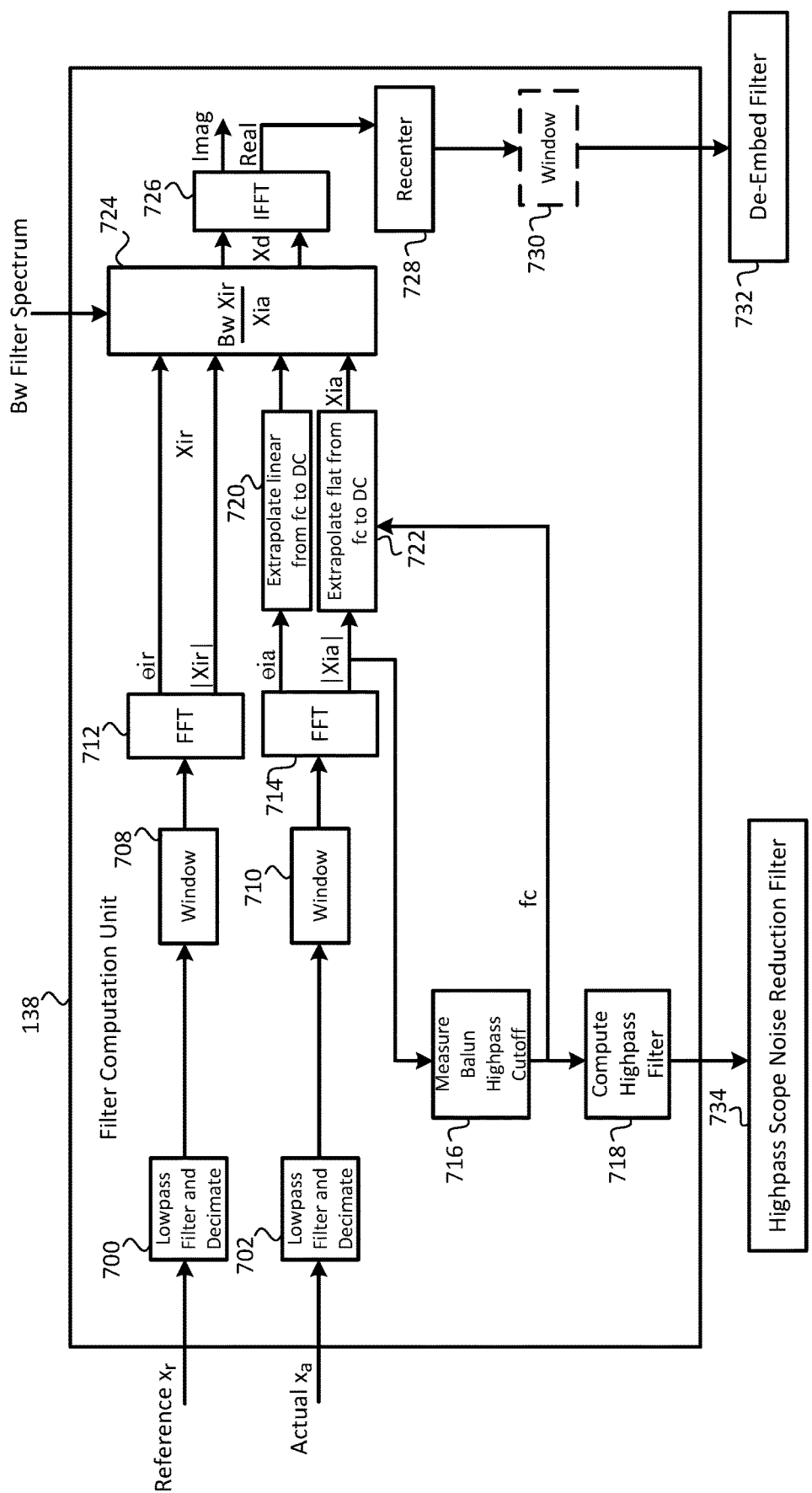
FIG. 7 shows a block diagram for generating one or more filters according to other embodiments of the disclosure.

FIGS. 5-7 illustrate an alternative embodiment for calibrating the test and measurement instrument 130 using a test assembly 500 including a PRBS generator 502. Similar to FIG. 2, the test assembly 500 is connected to two channels 132 of the test and measurement instrument 130 through cables 504 and 506. A differential signal pair is output from the PRBS generator 502 and received at the two channels 132 of the test and measurement instrument 130. One channel 132 receives a positive side of a reference differential signal pair from the PRBS generator 502 and the other channel 132 receives a negative side of the reference differential signal pair from PRBS generator 502. The positive side and negative side signals may each be respectively received at a channel 132 and digitized through an ADC 134. Many PRBS repeats of the pattern are gathered and stored in memory 144. The processor 136 generates a reference impulse response $xi_r$ using clock recovery, as would be understood by one skilled in the art. That is, the pattern from the PRBS generator 502 is known and the transfer function from the ideal known pattern to the acquired pattern is computed in the form of the reference impulse response $xi_r$.

To do so, the clock may be recovered and the acquired data may be recovered. Then, correlation can be used to recover the repeat of the pattern, which is averaged. A high pass filter with a frequency cutoff fc equal to the combiner 120 frequency cutoff fc can be applied to the known ideal pattern. The filtered ideal pattern may be windowed, as well as the acquired PRBS pattern. The FFT of each can be computed to cover the ideal pattern and acquired PRBS pattern to the frequency domain. The acquired pattern may be divided into the ideal pattern in the frequency domain, and, using IFFT, the result is transformed into the time domain and re-centered to obtain the impulse response as the real part of the IFFT transformation.

Similar to FIG. 3, FIG. 6 illustrates the configuration for determining the actual impulse response $xi_a$ when the test assembly 500 is connected to the acquisition assembly 300, which sends an output signal to a single channel 132 of the test and measurement instrument 130. A similar procedure may be performed to determine $xi_a$ as was performed to determine $xi_r$, discussed above. That is, multiple occurrences of the pattern can be averaged together, and using the known ideal pattern, the actual impulse response $xi_a$ is calculated.

FIG. 7 illustrates the operation of the filter computation unit 138 to generate a high-pass filter 734 and a de-embed filter 732 based on reference impulse response $xi_r$ and the actual impulse response $xi_a$.

As seen in FIG. 7, computing the high-pass filter 734 and de-embed filter 732 when using the PRBS generator 502 is similar to using the TDT differential pulse generator 202. Since the input is already an impulse response though, the derivative blocks 404 and 406 may be omitted and not required. To compute the high pass filter 734 and the de-embed filter 732, the reference impulse signal $xi_r$ and the actual impulse signal signal $xi_a$ may each pass through a decimation and low-pass filter 700 and 702, which may be similar to decimation and low-pass filters 400 and 402.

A window function 708 and 710 can be applied to the impulse responses $xi_a$ and $xi_r$ to assure the ends of the record can be tapered to zero to prevent leakage. As mentioned above, an example of such a window function is a Blackman Harris window. However, other types of window functions may be used, as would be understood by one skilled in the art.

An FFT 712 and 714 converts the windowed impulse responses to the frequency domain to obtain $Xi_r$ and $Xi_a$, respectively. The magnitude $Xi_r$ and $Xi_a$ and the phase $\theta i_r$ and $\theta i_a$ of the FFT 712 and 714 results can be used for further processing steps.

The magnitude $Xi_a$ as a function of frequency can be analyzed to determine the combiner 120 high-pass cutoff 716. The frequency cutoff, fc, is obtained and a high set of high-pass filter coefficients may be determined 718 to generate a high-pass filter 734 to filter test and measurement instrument 130 noise that is added into the stop band of the combiner 120.

The spectrum of the actual step $Xi_a$ can be extrapolated from frequency slightly higher than the knee of the frequency cutoff fc down to DC. This is a linear extrapolation of the magnitude response 720. In some embodiments, the extrapolation may include averaging the magnitude response over a flat range and then point replicating from DC to the point it intersects with the actual magnitude response. A similar extrapolation 722 may be performed on the phase of the actual step $Xi_a$. Several points may be used to make a linear regression estimate of the slope for the extrapolation. However, as will be understood by one skilled in the art, other extrapolation methods may be used.

Using a bandwidth limit filter, a spectrum of the de-embed filter can be determined 724 by dividing $Xi_r$ by $Xi_a$. This may include choosing a Nyquist frequency and creating a complex conjugate set of data above the Nyquist frequency to the sampling frequency such that the magnitude response on each side of the Nyquist frequency is symmetrical, and the phase response on each side anti-symmetrical. An IFFT 726 can be applied to covert the result into the time domain. The imaginary part will be zero and the real part can be re-centered 728 in the circular output array to obtain the impulse response of the de-embed filter to generate the de-embed filter 732. In some embodiments, another window function 730 may be applied to prevent leakage to generate the de-embed filter 732.

This de-embed filter 732 and the high-pass filter 734 may be applied to the acquired signal from the combiner 120, as shown in FIG. 1, when the combiner 120 is connected to the DUT 110.

For the best acquisition, the cables 504 and 506 can be well-matched in phase and magnitude as a function of frequency. That is, to receive the most accurate acquisition the PRBS generator 402 can have zero common mode output.

Figure 8:
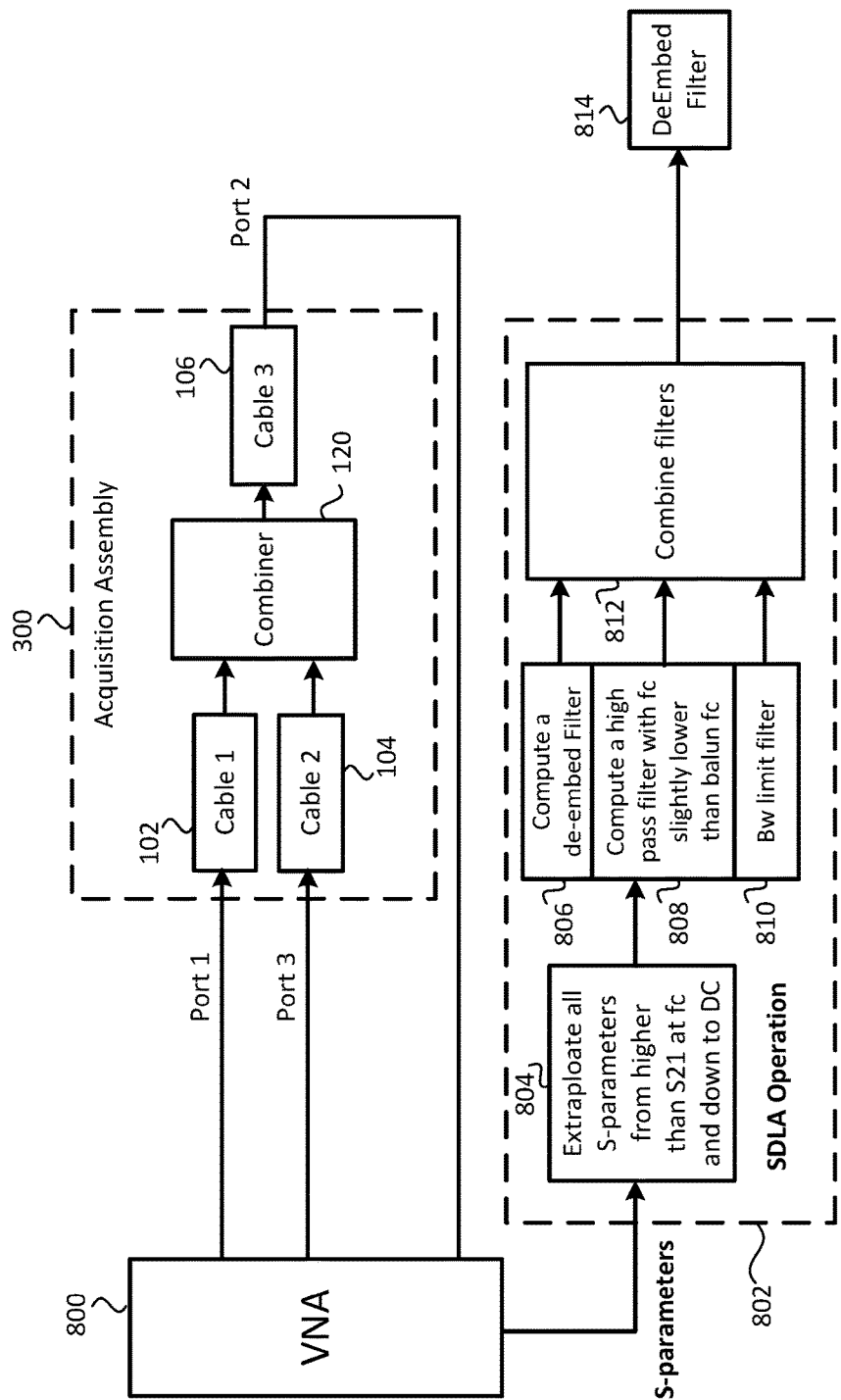
FIG. 8 shows a block diagram of another test assembly connected to a serial data link analysis (SDLA) operation according to other embodiments of the disclosure.

FIG. 8 illustrates another operation for calibrating the test and measurement instrument 130 using a vector network analyzer (VNA) 800, or another type of time domain reflection/time domain transmission device, along with a serial data link analysis (SDLA) operation 802 to measure the S-parameters of the combiner 120. The SDLA operation 802 may be performed by the one or more processors 136 in the test and measurement instrument 130 or may be performed on a remote processor and transferred to the test and measurement instrument 130. In the block diagram of FIG. 8, ports 1 and 3 are input ports of the VNA 800 and port 2 is an output port.

Ports 1 and 3 are connected to cables 102 and 104 of the acquisition assembly 300 and port 2 is connected to cable 106 to receive the output from the combiner 120. The S-parameters of the acquisitions assembly 300 can be extrapolated 804 from higher than S21 at the frequency cutoff fc and down to DC. The SDLA operation 802 generates 806 a de-embed filter, generates 808 a noise reduction high-pass filter with the frequency cutoff fc slightly lower then the combiner 120 frequency cutoff fc, and generates 810 a lowpass noise reduction bandwidth filter with a frequency cutoff fc at the desired bandwidth for performing the measurements while minimizing the amount of noise boost from the de-embed operation. All three of the filters may be combined 812 with convolution in the time domain or multiplication in the frequency domain to generate a de-embed filter 814. Once the de-embed filter 814 is generated, then the acquisition assembly 300 will be connected to the DUT 110 to receive acquisitions, as discussed below with respect to FIG. 9.

FIG. 9 illustrates a block diagram of a DUT 110 attached to an acquisition assembly 300, which includes cables 102 and 104, the combiner 120 126, and cable 106 to connect the acquisition assembly 300 to the test and measurement instrument 130 which has been calibrated using one of the operations discussed above. For ease of illustration, only some components of the test and measurement instrument 130 are illustrated in FIG. 9. The DUT 110 outputs a differential signal pair to the combiner 120 through cables 102 and 104. The combiner 120 combines the differential signal pair and outputs a signal through cable 106 to a single channel 132 of the test and measurement instrument 130. The signal is digitized through ADC 134 and sent through a high-pass filter 900, which may be high-pass filter 434 or 734 generated during calibration and a de-embed filter 902, which may be a de-embed filter 432, 732 and 814, also generated during calibration, to output the acquired signal with the combiner 120 de-embedded. The high-pass filter 434 or 734 may not be used when the de-embed filter was generated using the VNA calibration process discussed above with respect to FIG. 8. In FIG. 8 the high-pass filter was included in the computation of the de-embed filter. Likewise, in all of the examples the high-pass filter may be combined with the de-embed filter and applied as a single filter. They are shown separately to highlight the application of each.

As mentioned above, embodiments disclosed herein calibrate the test and measurement instrument 130 so that the test and measurement instrument 130 can de-embed a combiner from an acquired differential signal, such that only one channel of the test and measurement instrument 130 is utilized to receive the signal to reduce the noise from the test and measurement instrument in the stop band of the combiner 120.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples of the disclosure may operate on a particularly created hardware, on firmware, digital signal processors, or on a specially programmed computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described regarding a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement system comprising a plurality of channels and one or more processors, coupled with the plurality of channels. The one or more processors are configured to cause the test and measurement system to receive, via a first channel of the plurality of channels, a positive side of a reference differential signal pair; receive, via a second channel of the plurality of channels, a negative side of the reference differential signal pair; produce a reference signal based on the positive side of the reference differential signal pair and the negative side of the reference differential signal pair; receive a combined signal, from a combiner, that is a balanced signal produced from the positive side of the reference differential signal pair and the negative side of the reference differential signal pair; generate a de-embed filter based on the reference signal and the combined signal; receive an additional signal from the combiner; and remove an effect of the combiner from the additional signal by applying the de-embed filter to the additional signal.

Example 2 is the test and measurement system of example 1, wherein the one or more processors are further configured to cause the test and measurement instrument to generate a high-pass filter based on the combined signal; and remove noise from the additional signal by applying the high-pass filter to the additional signal.

Example 3 is the test and measurement system of example 2, wherein the one or more processors are further configured to cause the test and measurement instrument to generate the high-pass filter based on the combined signal by converting the combined signal into a frequency domain, determining a frequency cutoff of the combiner based on the combined signal, and generating the high-pass filter based on the frequency cutoff.

Example 4 is the test and measurement system of any one of examples 1-3, wherein the one or more processors are further configured to cause the test and measurement instrument to generate the de-embed filter based on the reference signal and the combined signal by converting the reference signal and the combined signal to the frequency domain, determining a spectrum by dividing the reference signal in the frequency domain by the combined signal in the frequency domain, and converting the spectrum to a time domain to generate the de-embed filter.

Example 5 is the test and measurement system of example 4, wherein the one or more processors are further configured to cause the test and measurement instrument to generate the de-embed filter based on the reference signal and the combined signal by performing a circular shift of the converted spectrum to the time domain to generate the de-embed filter.

Example 6 is the test and measurement system of example 4, wherein the one or more processors are further configured to cause the test and measurement instrument to generate the de-embed filter based on the reference signal and the combined signal by extrapolating a magnitude of the combined signal in the frequency domain from a frequency cutoff to zero frequency to determine the magnitude of the combined signal as a function of frequency and extrapolating a phase of the combined signal in the frequency domain from a frequency cutoff to zero frequency to determine the phase of the combined signal as a function of frequency.

Example 7 is the test and measurement system of any one of examples 1-6, wherein the combiner is a high-pass device.

Example 8 is the test and measurement system of any one of examples 1-7, wherein the combiner is a balun.

Example 9 is a method for de-embedding a combiner from an acquired signal from a device under test, comprising receiving, via a first channel of a plurality of channels, a first side of a reference differential signal pair; receiving, via a second channel of the plurality of channels, a second side of the reference differential signal pair; producing a reference signal based on the first side of the reference differential signal pair and the second side of the reference differential signal pair; receiving a combined signal, from a combiner, that is a balanced signal produced from the first side of the reference differential signal pair and the second side of the reference differential signal pair; generating a de-embed filter based on the reference signal and the combined signal; receiving an additional signal from the combiner; and removing an effect of the combiner from the additional signal by applying the de-embed filter to the additional balanced signal.

Example 10 is the method of example 9, further comprising generating a high-pass filter based on the combined signal; and removing noise from the additional signal by applying the high-pass filter to the additional signal.

Example 11 is the method of example 10, wherein generating the high-pass filter based on the combined signal includes converting the combined signal into a frequency domain, determining a frequency cutoff of the combiner based on the combined signal, and generating the high-pass filter based on the frequency cutoff.

Example 12 is the method of any one of examples 9-11, wherein generating the de-embed filter based on the reference signal and the combined signal includes converting the reference signal and the combined signal to the frequency domain, determining a spectrum by dividing the reference signal in the frequency domain by the combined signal in the frequency domain, and converting the spectrum to a time domain to generate the de-embed filter.

Example 13 is the method of example 12, wherein generating the de-embed filter based on the reference signal and the combined signal includes performing a circular shift of the converted spectrum to the time domain to generate the de-embed filter.

Example 14 is the method of either example 12 or 13, wherein generating the de-embed filter based on the reference signal and the combined signal includes extrapolating a magnitude of the combined signal in the frequency domain from a frequency cutoff to zero frequency to determine the magnitude of the combined signal as a function of frequency and extrapolating a phase of the combined signal in the frequency domain from a frequency cutoff to zero frequency to determine the phase of the combined signal as a function of frequency.

Example 15 is the method of claim 9, wherein the combiner is a balun.

Example 16 is one or more computer readable storage media having instructions stored thereon that, when executed by a processor of a test and measurement instrument, cause the test and measurement instrument to receive, via a first channel of a plurality of channels, a positive side of a reference differential signal pair; receive, via a second channel of the plurality of channels, a negative side of the reference differential signal pair; produce a reference signal based on the positive side of the reference differential signal pair and the negative side of the reference differential signal pair; receive a combined signal, from a combiner, that is a balanced signal produced from the positive side of the reference differential signal pair and the negative side of the reference differential signal pair; generate a de-embed filter based on the reference signal and the combined signal; receive an additional balanced signal from the combiner; and remove an effect of the combiner from the additional balanced signal by applying the de-embed filter to the additional balanced signal.

Example 17 is the one or more computer readable storage media of example 16, further including instructions to cause the test and measurement instrument to generate a high-pass filter based on the combined signal; and remove noise from the additional signal by applying the high-pass filter to the additional signal.

Example 18 is the one or more computer readable storage media of example 17, further comprising instructions to cause the test and measurement instrument to generate the high-pass filter based on the combined signal by converting the combined signal into a frequency domain, determining a frequency cutoff of the combiner based on the combined signal, and generating the high-pass filter based on the frequency cutoff.

Example 19 is the one or more computer readable storage media of any one of examples 16-18, further comprising instructions to cause the test and measurement instrument to generate the de-embed filter based on the reference signal and the combined signal by converting the reference signal and the combined signal to the frequency domain, determining a spectrum by dividing the reference signal in the frequency domain by the combined signal in the frequency domain, and converting the spectrum to a time domain to generate the de-embed filter.

Example 20 is the one or more computer readable storage media of any one of examples 16-19, wherein the combiner is a balun.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement system comprising:
a plurality of channels; and
one or more processors, coupled with the plurality of channels, configured to cause the test and measurement system to:
receive, via a first channel of the plurality of channels, a positive side of a reference differential signal pair;
receive, via a second channel of the plurality of channels, a negative side of the reference differential signal pair;
produce a reference signal based on the positive side of the reference differential signal pair and the negative side of the reference differential signal pair;
receive a combined signal, from a combiner, that is a balanced signal produced from the positive side of the reference differential signal pair and the negative side of the reference differential signal pair;
generate a de-embed filter based on the reference signal and the combined signal;
receive an additional signal from the combiner when the combiner is connected to a device under test; and
remove an effect of the combiner from the additional signal by applying the de-embed filter to the additional signal.

2. The test and measurement system of claim 1, wherein the one or more processors are further configured to cause the test and measurement instrument to:
generate a high-pass filter based on the combined signal; and
remove noise from the additional signal by applying the high-pass filter to the additional signal.

3. The test and measurement system of claim 2, wherein the one or more processors are further configured to cause the test and measurement instrument to generate the high-pass filter based on the combined signal by:
converting the combined signal into a frequency domain,
determining a frequency cutoff of the combiner based on the combined signal, and
generating the high-pass filter based on the frequency cutoff.

4. The test and measurement system of claim 1, wherein the one or more processors are further configured to cause the test and measurement instrument to generate the de-embed filter based on the reference signal and the combined signal by:
converting the reference signal and the combined signal to the frequency domain,
determining a spectrum by dividing the reference signal in the frequency domain by the combined signal in the frequency domain, and
converting the spectrum to a time domain to generate the de-embed filter.

5. The test and measurement system of claim 4, wherein the one or more processors are further configured to cause the test and measurement instrument to generate the de-embed filter based on the reference signal and the combined signal by performing a circular shift of the converted spectrum to the time domain to generate the de-embed filter.

6. The test and measurement system of claim 4, wherein the one or more processors are further configured to cause the test and measurement instrument to generate the de-embed filter based on the reference signal and the combined signal by extrapolating a magnitude of the combined signal in the frequency domain from a frequency cutoff to zero frequency to determine the magnitude of the combined signal as a function of frequency and extrapolating a phase of the combined signal in the frequency domain from a frequency cutoff to zero frequency to determine the phase of the combined signal as a function of frequency.

7. The test and measurement system of claim 1, wherein the combiner is a high-pass device.

8. The test and measurement system of claim 1, wherein the combiner is a balun.

9. A method of de-embedding a combiner from an acquired signal received from a device under test, comprising:
receiving, via a first channel of a plurality of channels, a first side of a reference differential signal pair;
receiving, via a second channel of the plurality of channels, a second side of the reference differential signal pair;
producing a reference signal based on the first side of the reference differential signal pair and the second side of the reference differential signal pair;
receiving a combined signal, from a combiner, that is a balanced signal produced from the first side of the reference differential signal pair and the second side of the reference differential signal pair;
generating a de-embed filter based on the reference signal and the combined signal;
receiving the acquired signal from the combiner; and
removing an effect of the combiner from the acquired signal by applying the de-embed filter to the acquired signal.

10. The method of claim 9, further comprising:
generating a high-pass filter based on the combined signal; and
removing noise from the acquired signal by applying the high-pass filter to the acquired signal.

11. The method of claim 10, wherein generating the high-pass filter based on the combined signal includes:
converting the combined signal into a frequency domain,
determining a frequency cutoff of the combiner based on the combined signal, and
generating the high-pass filter based on the frequency cutoff.

12. The method of claim 9, wherein generating the de-embed filter based on the reference signal and the combined signal includes:
converting the reference signal and the combined signal to the frequency domain,
determining a spectrum by dividing the reference signal in the frequency domain by the combined signal in the frequency domain, and
converting the spectrum to a time domain to generate the de-embed filter.

13. The method of claim 12, wherein generating the de-embed filter based on the reference signal and the combined signal includes performing a circular shift of the converted spectrum to the time domain to generate the de-embed filter.

14. The method of claim 12, wherein generating the de-embed filter based on the reference signal and the combined signal includes extrapolating a magnitude of the combined signal in the frequency domain from a frequency cutoff to zero frequency to determine the magnitude of the combined signal as a function of frequency and extrapolating a phase of the combined signal in the frequency domain from a frequency cutoff to zero frequency to determine the phase of the combined signal as a function of frequency.

15. The method of claim 9, wherein the combiner is a balun.

16. One or more computer readable storage media having instructions stored thereon that, when executed by a processor of a test and measurement instrument, cause the test and measurement instrument to:
- receive, via a first channel of a plurality of channels, a positive side of a reference differential signal pair;
- receive, via a second channel of the plurality of channels, a negative side of the reference differential signal pair;
- produce a reference signal based on the positive side of the reference differential signal pair and the negative side of the reference differential signal pair;
- receive a combined signal, from a combiner, that is a balanced signal produced from the positive side of the reference differential signal pair and the negative side of the reference differential signal pair;
- generate a de-embed filter based on the reference signal and the combined signal;
- receive an additional balanced signal from the combiner when the combiner is connected to a device under test; and
- remove an effect of the combiner from the additional balanced signal by applying the de-embed filter to the additional balanced signal.

17. The one or more computer readable storage media of claim 16, further including instructions to cause the test and measurement instrument to:
- generate a high-pass filter based on the combined signal; and
- remove noise from the additional balanced signal by applying the high-pass filter to the additional balanced signal.

18. The one or more computer readable storage media of claim 17, further comprising instructions to cause the test and measurement instrument to generate the high-pass filter based on the combined signal by:
- converting the combined signal into a frequency domain,
- determining a frequency cutoff of the combiner based on the combined signal, and
- generating the high-pass filter based on the frequency cutoff.

19. The one or more computer readable storage media of claim 16, further comprising instructions to cause the test and measurement instrument to generate the de-embed filter based on the reference signal and the combined signal by:
- converting the reference signal and the combined signal to the frequency domain,
- determining a spectrum by dividing the reference signal in the frequency domain by the combined signal in the frequency domain, and
- converting the spectrum to a time domain to generate the de-embed filter.

20. The one or more computer readable storage media of claim 16, wherein the combiner is a balun.

* * * * *